(12) United States Patent
Tomaiuolo et al.

(10) Patent No.: US 6,487,140 B2
(45) Date of Patent: Nov. 26, 2002

(54) CIRCUIT FOR MANAGING THE TRANSFER OF DATA STREAMS FROM A PLURALITY OF SOURCES WITHIN A SYSTEM

(75) Inventors: Francesco Tomaiuolo, Monte Sant' Angelo (IT); Fabrizio Campanale, Bari (IT); Salvatore Nicosia, Palermo (IT); Luca Giuseppe De Ambroggi, Catania (IT); Promod Kumar, Motta S. Anastasia (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 15 days.

(21) Appl. No.: 09/773,363

(22) Filed: Jan. 31, 2001

(65) Prior Publication Data

US 2001/0033524 A1 Oct. 25, 2001

(30) Foreign Application Priority Data

Jan. 31, 2000 (EP) .............................. 00830068
May 19, 2000 (EP) .............................. 00830364

(51) Int. Cl.[7] ................................. G11C 8/00
(52) U.S. Cl. ................. 365/233; 365/230.03; 711/5; 711/157
(58) Field of Search ................. 365/230.03, 230.08, 365/233; 711/5, 157

(56) References Cited

U.S. PATENT DOCUMENTS

| | | |
|---|---|---|
| 5,559,990 A | 9/1996 | Cheng et al. ............... 395/484 |
| 5,596,539 A | 1/1997 | Passow et al. ............... 365/210 |
| 5,696,917 A | 12/1997 | Mills et al. .................. 395/401 |
| 5,778,166 A * | 7/1998 | Andoh et al. ................ 711/114 |
| 5,966,724 A | 10/1999 | Ryan .......................... 711/105 |
| 6,138,206 A * | 10/2000 | Fisher et al. ................. 711/118 |

FOREIGN PATENT DOCUMENTS

| | | | |
|---|---|---|---|
| EP | 0561370 | 9/1993 | ............. G11C/7/00 |
| EP | 0961283 | 12/1999 | ............. G11C/7/00 |

* cited by examiner

Primary Examiner—Richard Elms
Assistant Examiner—Van Thu Nguyen
(74) Attorney, Agent, or Firm—Lisa K. Jorgenson; Allen, Dyer, Doppelt, Milbrath & Gilchrist, P.A.

(57) ABSTRACT

A control circuit manages transferring of data within a system, such as an interleaved memory. The system includes a plurality of data sources for providing an output data stream synchronous with an external timing signal, an output register for storing data available at an output of the system, and a selection multiplexer for transferring the data from the plurality of data sources to the output register. The control circuit includes a plurality of circuit blocks, with each circuit block being dedicated to one of the plurality of data sources. Each circuit block includes a detection circuit for detecting availability of the data at an output of a selected data source, and a conditioned update path connected to the detection circuit provides an update flag. A logic gate having a first input receives the update flag and a second input receives an output signal from the detection circuit for providing a selection signal for the selection multiplexer.

39 Claims, 10 Drawing Sheets

CIRCUIT FOR MANAGING THE TRANSFER OF DATA STREAMS FROM A PLURALITY OF SOURCES WITHIN A SYSTEM

FIELD OF THE INVENTION

The present invention concerns in general integrated digital systems and, more in particular, to a system in which streams of digital data from sources of different characteristics, asynchronous or of different bit rates, must be coordinately conveyed to an output channel. The invention is particularly though not exclusively useful in an interleaved synchronous memory.

BACKGROUND OF THE INVENTION

In many applications the need may arise to organize a data flow at a certain bit rate in synchronization with an external clock under the control of an external systems controller. This may be done by combining together distinct data streams coming from internal asynchronous sources and/or having different bit rates.

Requirements of this kind are often encountered in data transmission systems where there may be a relatively broad band channel capable of operating at a relatively high speed, on which must be transmitted data coming from different sources. These different sources are relatively slower and often asynchronous. Another very peculiar example of such a system are interleaved synchronous memories.

The ATD (Address Transition Detection) signal recognizes a change of the address input by the external circuitry, and therefore, the new request of access and initiates a new read cycle. After enabling the sense amplifiers by the signal SAenable, an equalization of the sensing circuitry takes place. At the end of which, as timed by the signal EQZ, the effective reading of the memory cells takes place. Finally, after a certain interval of time that may vary from device to device, by way of a signal SAlatch, the recording of the read data into the latches in cascade to the sense amplifiers takes place, from where the read word may be transferred to the output buffers.

In memory devices designed for a synchronous read mode with a sequential type (burst) of access, the reading process exploits the fact that the reading takes place by successive locations. That is, the subsequent memory location to be read, and therefore, its address, is predictable from the address of the location being currently read.

A subgroup of these sequential (burst) synchronous read mode memories is represented by the interleaved memories. A burst access interleaved memory is described in U.S. Pat. No. 5,559,990, for example. In this type of memory, the cell array is divided in two semi-arrays or banks, each having its own read circuitry. The read streams of the two banks are thereafter superimposed according to one of the most commonly followed approaches. They are outphased, i.e., out of phase, from each other. While on one of the two banks or semi-array the steps of evaluation and transfer of the data to the output are being performed, on the other bank or semi-array (the next location to be addressed) a new read cycle may start without waiting for the conclusion of the current read cycle that involves the first semi-array.

In interleaved memories, a basic scheme of which is depicted in FIG. 1, the array is divided into two independent banks or semi-arrays, EVEN and ODD, respectively, each having its own independent read path. Typically, there are two counters (one for each bank) containing the address of the currently pointed memory location. In case of simultaneous reading processes evolving respectively on the two semi-arrays, the least significant bit of the address (A0) supports the multiplexing between the EVEN and the ODD banks. If A0=0, the data coming from the EVEN semi-array will be made available at the output. If A0=1, the data coming from the ODD semi-array will be made available at the output.

As it is commonly known, the reading of the two semi-arrays is carried out according to one of two different approaches. A first approach is simultaneous readings and multiplexing of the outputs. A second approach involves time readings that are out of phase.

According to the first approach, the readings are simultaneous on the two banks. The data read are stored in respective output registers and made available to the outside world in synchronization with an external clock signal. According to the second approach, the readings on the two semi-arrays have an alternate and interleaved evolution over time.

The first approach, though offering a simpler hardware implementation, limits the minimization of the start times of synchronous read cycles. For a better comprehension, it is necessary to consider the basic steps that are performed when passing from an asynchronous read mode to a synchronous read mode.

With reference to the scheme of FIG. 2, and starting the reading from an address X, the latter will be loaded on the EVEN bank counter and on the ODD bank counter, less the least significant bit (A0) of the address. The two counters will point to the same location X of the respective bank or semi-array.

If A0=0: the first read data is relative to the address X of the bank EVEN and the successive read data is the data X of the bank ODD.

If A0=1: the first read data is relative to the address X of the bank ODD and the successively read data is relative to the X+1 address of the bank EVEN.

In the first case, it is sufficient to perform a simultaneous reading of the two banks and multiplex the outputs. In the second instance, it is necessary to increment the counter before starting the reading on the bank EVEN.

Usually, known synchronous memory devices do not make any initial increment and wait for the successive cycle for incrementing both counters, and therefore, read the location X+1 of the banks EVEN and ODD. This makes the times of the first read cycle and of the second sequential read cycle at best equal to the asynchronous read mode time of the memory.

In general, it may be stated that the efficient management of the read processes has a direct influence of the performance of the memory device. Many read-path architectures have been proposed. Known read-path architectures have generally been conceived for responding efficiently to either one or the other of the two modes of operation: asynchronous or synchronous.

If a memory device is designed to be read in an asynchronous mode, it will be generally provided with a rather simple control circuitry for the read data streams. This allows the use of adaptive structures, such as dummy wordlines and dummy sense amplifiers, while leaving the reading circuitry free to evolve as fast as possible in order to achieve the shortest asynchronous access delays.

In contrast, in memory devices designed to function in a burst access mode or in a synchronous read mode, the possibility of making available in output a certain number of words read and stored in advance, permits, after a first asynchronous access, as long as it may be, a series of extremely fast read cycles. In this case though, the control logic must intervene extensively to manage the sense amplifiers which should not be left to evolve freely but be enabled, equalized and read at precise instants established by the control system. Prior European Patent Application Serial No. EP-98830801, filed on Dec. 30, 1998, and Italian Patent Application Serial No. MI99A00248, filed on Nov. 26, 1999, describe burst-mode EPROM devices with the above characteristics. These patent applications are both incorporated herein by reference in their entirety, and are assigned to the assignee of the present invention.

The access mode in a reading phase of operation is set to a specific protocol of use of two of the external protocol signals. These two signals are the address input latches enabling signal ALE and of the read stimulation signal RD.

The counters of the two semi-arrays, or the counter of the first bank and a more simpler register which functions as an address counter of the second bank, are incremented distinctly from one another. This is different from what is commonly done in interleaved memory devices. The readings are thus out of phase on the two banks from the first (asynchronous) read cycle. In this way, the memory device of the invention is perfectly able to switch to a synchronous mode reading phase at any time, which practically cuts in half the access time to such a mode.

The two different reading processes, according to an asynchronous random access mode and according to a synchronous burst access mode remain congruent with each other, having an alternate and interleaved evolution in time, as described in European Patent Application No. 00830068.3, filed on Jan. 31, 2000. This application is incorporated herein by reference in its entirety, and is assigned to the assignee of the present invention.

SUMMARY OF THE INVENTION

In view of the foregoing background and, more in general, with similar situations in which it would be advantageous to optimize the management of the data transfer within a system having sources of data of different bit rates and/or asynchronous, a circuit is provided to generate an output data stream synchronous with a certain clock provided by an external system controller.

A control circuit for managing transferring of data within a system is provided. The system preferably comprises a plurality of data sources for providing an output data stream synchronous with an external timing signal, an output register for storing data available at an output of the system, and a selection multiplexer for transferring the data from the plurality of data sources to the output register.

The control circuit may comprise a plurality of circuit blocks, with each circuit block being dedicated to one of the plurality of data sources and comprising a detection circuit for detecting availability of the data at an output of a selected data source, and a conditioned update path connected to the detection circuit for providing an update flag. A logic gate having a first input for receiving the update flag and a second input for receiving an output signal from the detection circuit may provide a selection signal for the selection multiplexer.

The system may further comprise an external data line connected to the output of the system, and an output buffer connected between the output register and the external data line. The control system may also include a pass-gate for coupling an input of the output buffer to the output register.

The pass-gate is preferably enabled by the output signal from a respective detection circuit.

The conditioned update path preferably may include a first bistable circuit for providing a first flag for enablement of the updating, an enable detection circuit having a first input connected to the first bistable latch for receiving the first flag, and a second bistable circuit connected to the enable detection circuit for providing the update flag.

In one embodiment of the present invention, the plurality of data sources are asynchronous. In another embodiment of the present invention, the plurality of data sources have different bit rates.

BRIEF DESCRIPTION OF THE DRAWINGS

The different aspects and advantages of the circuit of the invention will be more easily explained and understood through the following description of several embodiments thereof and by referring to the attached drawings, wherein.

DETAILED DESCRIPTION OF THE PREFERRED EMBODIMENTS

Figure 1:
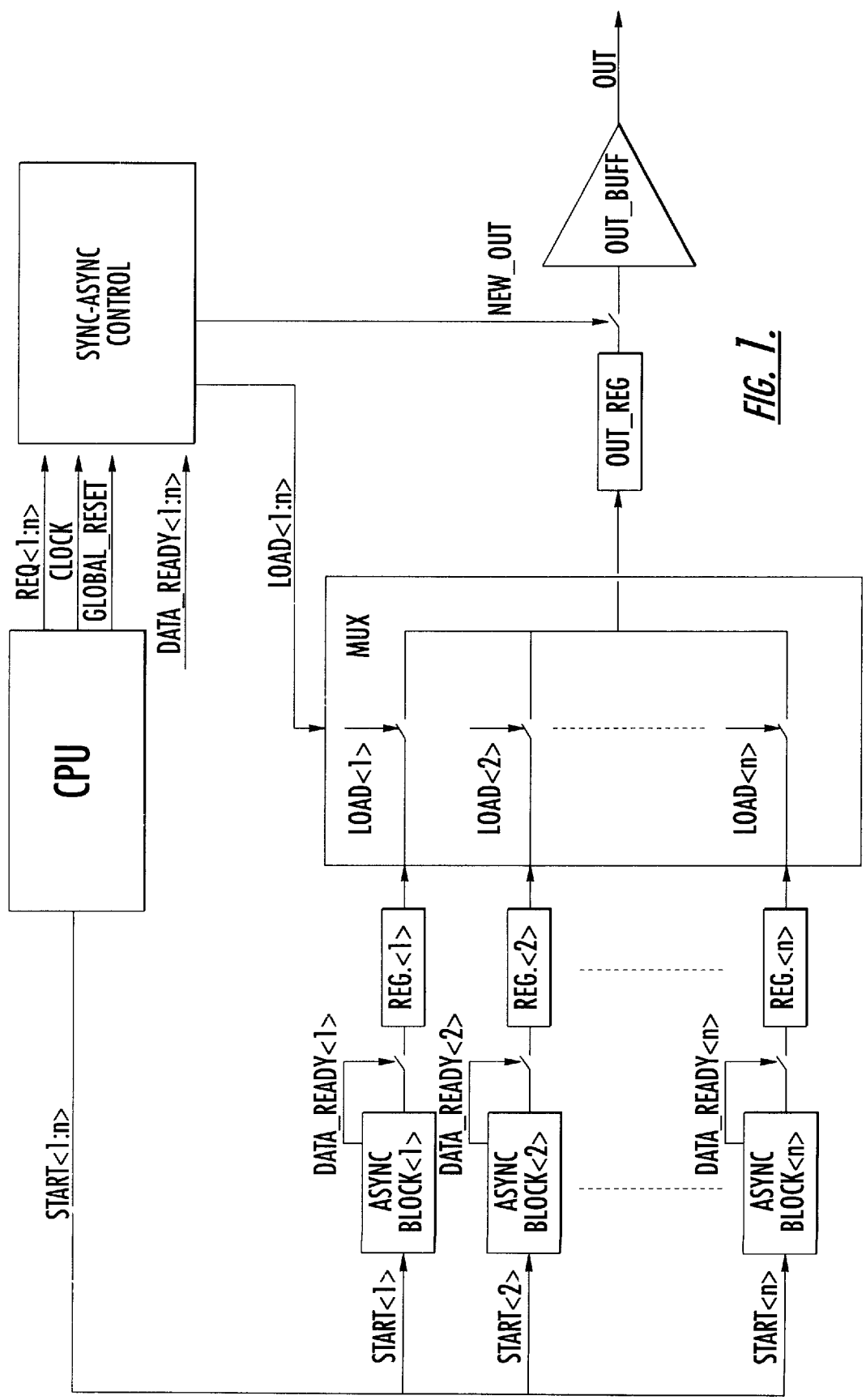
FIG. 1 is a general diagram of a system in which the circuit according to the present invention is usefully employed.

The basic scheme of the system having a controller CPU and several internal asynchronous blocks, ASYNC BLOCK<1:n> that are activated in a sequential fashion or in any other mode one at the time is depicted in FIG. 1.

Each of the asynchronous blocks, every time a specific command START<i> is issued by the controller, starts an internal process leading to the generation of certain output data. For example, the sense circuitry of a memory device reads data stored therein, an A/D converter provides an analog signal in a number of logic bits, and the like. Upon concluding the generation of the output data, it updates the content of an output register REG<i> of the stimulated data source, ASYNC BLOCK<1:>, by producing for this purpose a flag signal DATA_READY<i>.

Assume that the central control unit CPU must control the transfer of data placed into n output registers of the distinct asynchronous data source blocks toward a unique output register OUT REG of the system, as a function of a certain external timing signal clock also generated by the central control unit CPU.

Assume moreover that such a data transfer must take place in the shortest possible time, when the stimulated block <i> has the currently required data ready and the clock signal is still at logic zero. The latter condition indicates that the system is about to request new data at the output. Should the request of the output data, for example represented by the raising edge of the clock signal, anticipate slightly the DATA_READY signal, the system must still be able to output the correct data.

In such an exemplary situation, the data transfer managing system, SINC_ASYNC_CONTROL, efficiently fulfils its task, by processing the DATA_READY<i:n> signals. That is, the information that the content of the output registers of the respective asynchronous blocks has been updated. The external clock signals CLOCK and the signals REQ<1:n>. This is among the different output registers of the respective asynchronous blocks, and the appropriate signals LOAD<1:n> are generated for performing the loading of the correct data in the output register OUT REG. The signals REQ<1:n> enable only one of the data sources to transfer data toward the output register OUT REG purposely generated by the central control unit CPU for permitting a multiplexing by way of the relative MUX.

Such a system may functionally represent, for example, a card for the acquisition and conversion of n analog signals having a serial output bus. By assuming that the n asynchronous blocks are A/D converters, wherein an analog input is sampled at instants established by the central control unit CPU by way of the signal START<i>, the A/D converters will take a certain time for effecting the analog/digital conversion. When their task is terminated, they will generate a flag signal DATA_READY<i> that enables the updating of their respective output latches REG<i>.

Assuming, as often happens in many real systems, that the frequency of the output clock signal is n times greater than the speed of the A/D converters. This is to output the bits at the rate of the clock signal. It is necessary to multiplex the bits of the output latches of the respective converters into the output register OUT REG in order to output them in a serial fashion.

If the system's protocol contemplates that on the raising edge of the output clock signal the output must be updated as fast as possible with the new data so that an eventual external system may acquire it the shortest time possible, it is necessary to minimize the times of propagation of the bits from the A/D converters toward the output. For example, the new data may be acquired on the falling edge of the same clock pulse.

Figure 2:
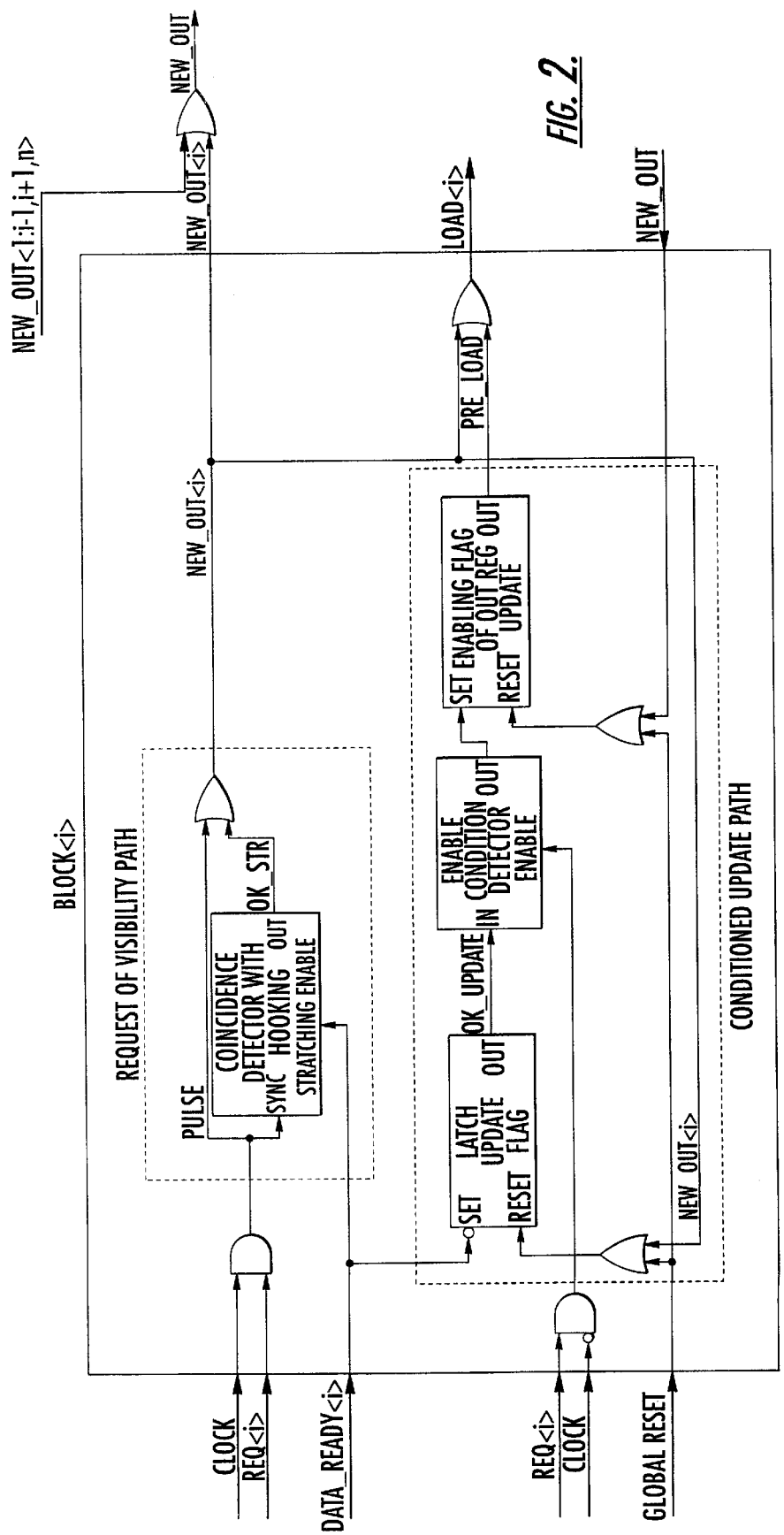
FIG. 2 is a detailed functional diagram of the system of FIG. 1.

These requirements are fulfilled in a most effective manner by the data transfer managing circuit of the invention. A functional diagram relative to the ith asynchronous block of the basic scheme of FIG. 1 is depicted in FIG. 2. The circuit of the invention will be formed of an n number of identical circuits, one for each data source to be managed. The data transfer managing circuit of each data source includes four functional blocks and sparse combinatory logic stages.

The block COINCIDENCE DETECTOR WITH HOOKING detects the presence of two simultaneous events. For example, a request of data in output and an updating of the output register of a pertinent data source block. More particularly, the condition of a relative delay of the ending of the second signal is with respect to the first. In this case, the peculiar hooking mechanism implemented by the block circuitry advantageously permits extending the loading pulses of the new data in the output register and of eventually making the new data available at the output. This is done by conditioning both of them congruently with the correct ending of the updating phase of the output register of the source block of the new requested data.

The block LATCH UPDATE FLAG signals the presence of an updating being performed or already terminated but still waiting for transferring the information in the output latch of the source block.

The block ENABLE CONDITION DETECTOR detects the condition of enablement to the loading in the output register OUT REG of the data contained in the output register of the source block.

The block ENABLING FLAG OF OUT REG UPDATE activates, when enabled, the path between the output latch of the source block and the output register OUT REG of the circuit. This is done by maintaining an active state until the request of visibility of data at the output that occurs upon the activation of the appropriate signal. That is, with the rising edge of the external timing signal CLOCK.

In the embodiment of FIG. 2, showing one of the n identical blocks of as many sources of data managed by the circuit, the circuit COINCIDENCE DETECTOR WITH HOOKING receives, at its input,, the signal PULSE, corresponding to the logic AND of the clock signal and a selection signal REQ<i> of the source of the next data to be output, and a confirmation signal of the availability of the data at the output of the selected source block DATA_READY<i>. The circuit outputs a stretching signal OK_STR.

The conditioned update path of the data being made available at the output is composed of:
  a first bistable circuit LATCH UPDATE FLAG set by the inverted confirmation signal DATA_READY<i> and reset by the logic OR of a global reset command GLOBAL_RESET generated by the central control unit CPU, and of the logic OR of the timing signal CLOCK, and of the stretching signal OK_STR. This circuit outputs a first flag of enablement for the updating OK_UPDATE;
  a detecting circuit of the enablement condition ENABLE CONDITION DETECTOR receiving in input the first flag OK_UPDATE and reproducing it in output as a function of the inverted timing signal CLOCK and of the source selection signal REQ<i>;
  a second bistable circuit ENABLING FLAG OF OUT REG UPDATE set by the output of the detecting circuit and reset by the logic OR of the signal GLOBAL_RESET, and of the signal NEW_OUT. This signal corresponds to the logic OR of the signals NEW_OUT<i> coming from the single sources <i>. This circuit outputs the update flag PRE_LOAD;
  a logic OR gate, input with the update flag PRE-LOAD and with the logic OR of the signal PULSE, and of the stretching signal OK_STR. This circuit produces in output a selection signal LOAD<i> for the multiplexer; and
  a pass-gate coupling the input of an output buffer OUT BUFF to the respective output register OUT REG, enabled by the logic OR signal, NEW_OUT, of the signals NEW_OUT<i>. Each corresponds to the logic OR of the signal PULSE and of the stretching signal OK_STR of the managing circuit (block <i>) of a respective data source <i>.

Figure 3:
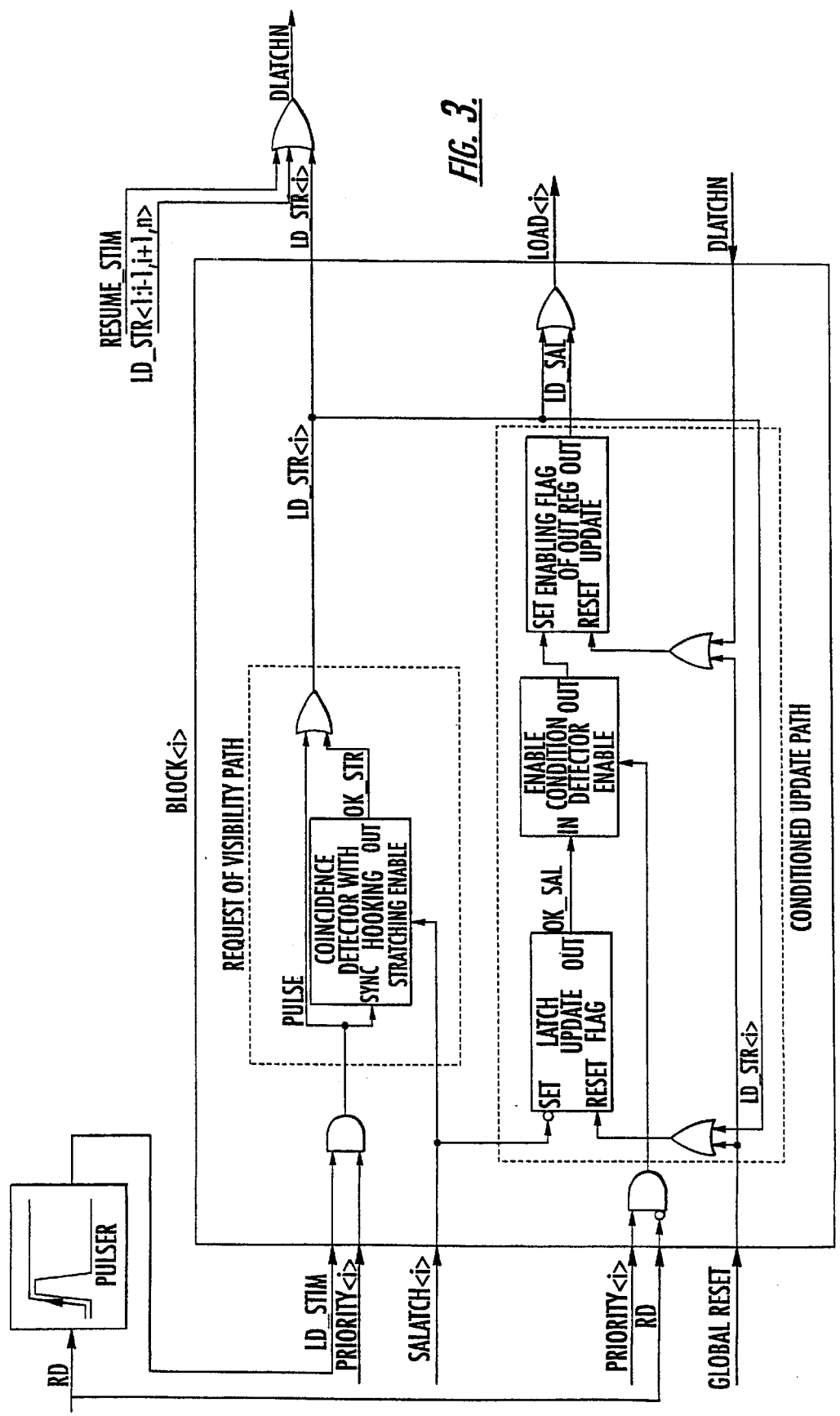
FIG. 3 is a reproduction of the diagram of FIG. 2, wherein the labels of the input signals are for an interleaved synchronous memory.

In order to illustrate the usefulness of the circuit of the invention in an interleaved memory device, as discussed above, the functional scheme of FIG. 2 is replicated as FIG. 3 by modifying the labels of the different signals to correspond to the usual labels in the context of a memory device.

In this case, the external synchronization signal provided by a control unit is represented by the read stimulation signal RD, while the signal confirming the availability of the requested data at the output of a bank of subdivision of the memory matrix SAlatch, corresponds to the confirmation signal of the availability of the data at the output of the source block DATA_READY of FIG. 2.

The selection signal of the source REQ<i>, in case of an interleaved memory device, corresponds to the signal PRIORITY<i> that selects alternately one or the other of two (or more) banks of subdivision of the array of memory cells to generate appropriate loading signals. Finally, the signal NEW_OUT that makes the new data available at the output, corresponds in case of an interleaved memory device, to the signal DLATCHN.

In FIG. 3 is shown also an optional external block called PULSER that cooperates with the data transfer managing circuit of the invention. This circuit may be a simple monostable circuit, input with the external timing signal RD and outputting a pulse LD_STIM, of preestablished duration at every rising edge of the external protocol signal RD.

Such an optional external block PULSER is useful in applications where the duty-cycle of the external synchronization signal RD should be rendered independent from the timing requirements of the control circuit of the specific device that may impose a minimum duration of the signal that enables the transfer of new data to the output buffer.

Figure 4:
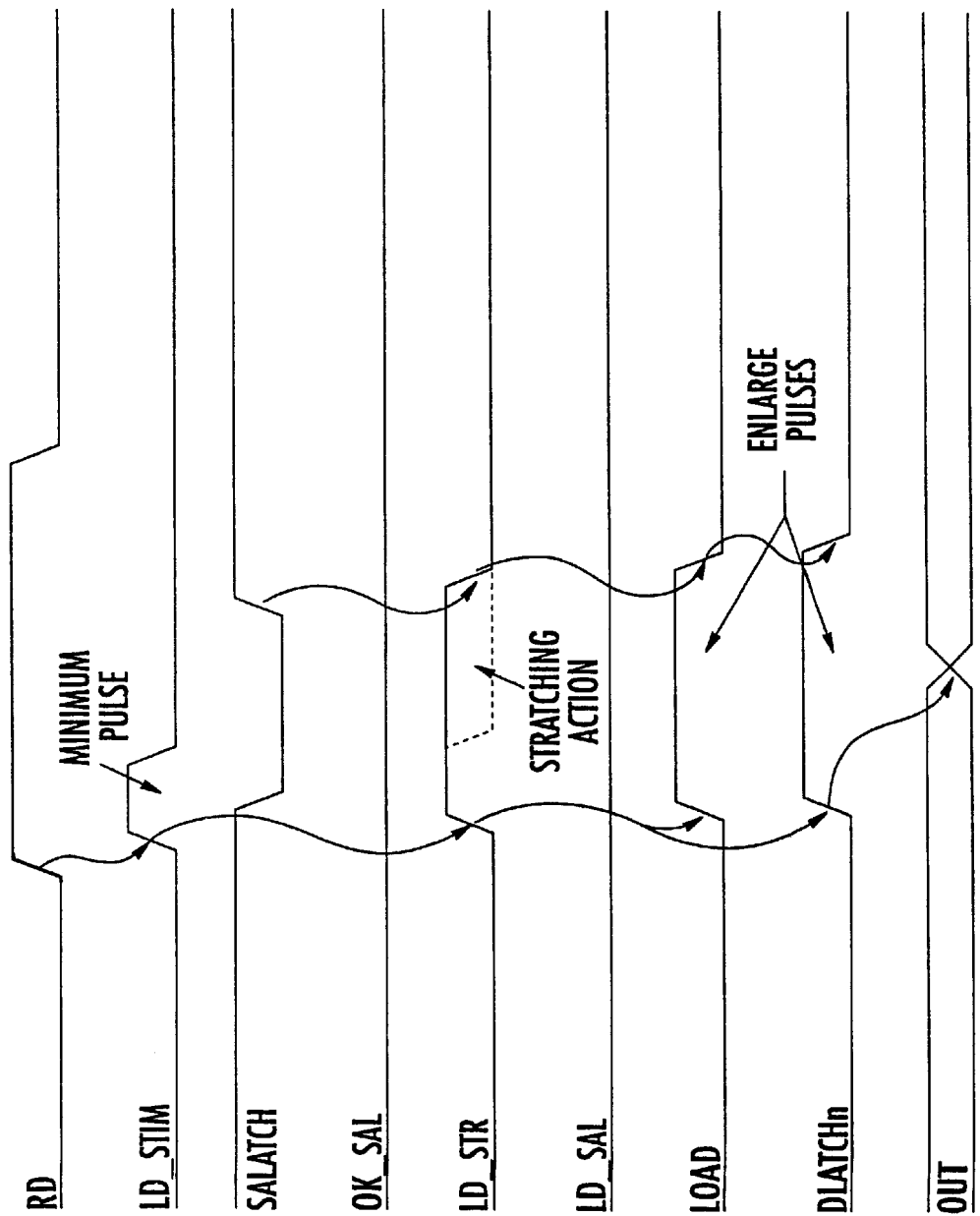
FIGS. 4, 5, 6 and 7 show different situations of reading data to be output according to the present invention.

FIG. 4 shows the situation in which the reading ends after the stimulation of request of visibility of the data in output. In this case, the block COINCIDENCE DETECTOR WITH HOOKING interfaces or hooks with the pulsed signal LD_STIM, stretching it and connecting it to the instant of termination of the SAlatch pulse.

As may be observed, the LD_STR signal becomes active with the rising edge of the signal LD_STIM and ends only when SAlatch goes to the logic value 1, that is, when the reading terminates. In contrast, in FIGS. 5 and 6, the reading ends before the rising edge of RD.

The circuit DETECTOR does not implement the hooking because it is unnecessary and, therefore, the structure renders a replica of LD_STIM. It may be noted that in FIGS. 5 and 6 the SAlatch signal becomes active before the rising edge of RD and, therefore, before a request of new data by the user.

Figure 5:
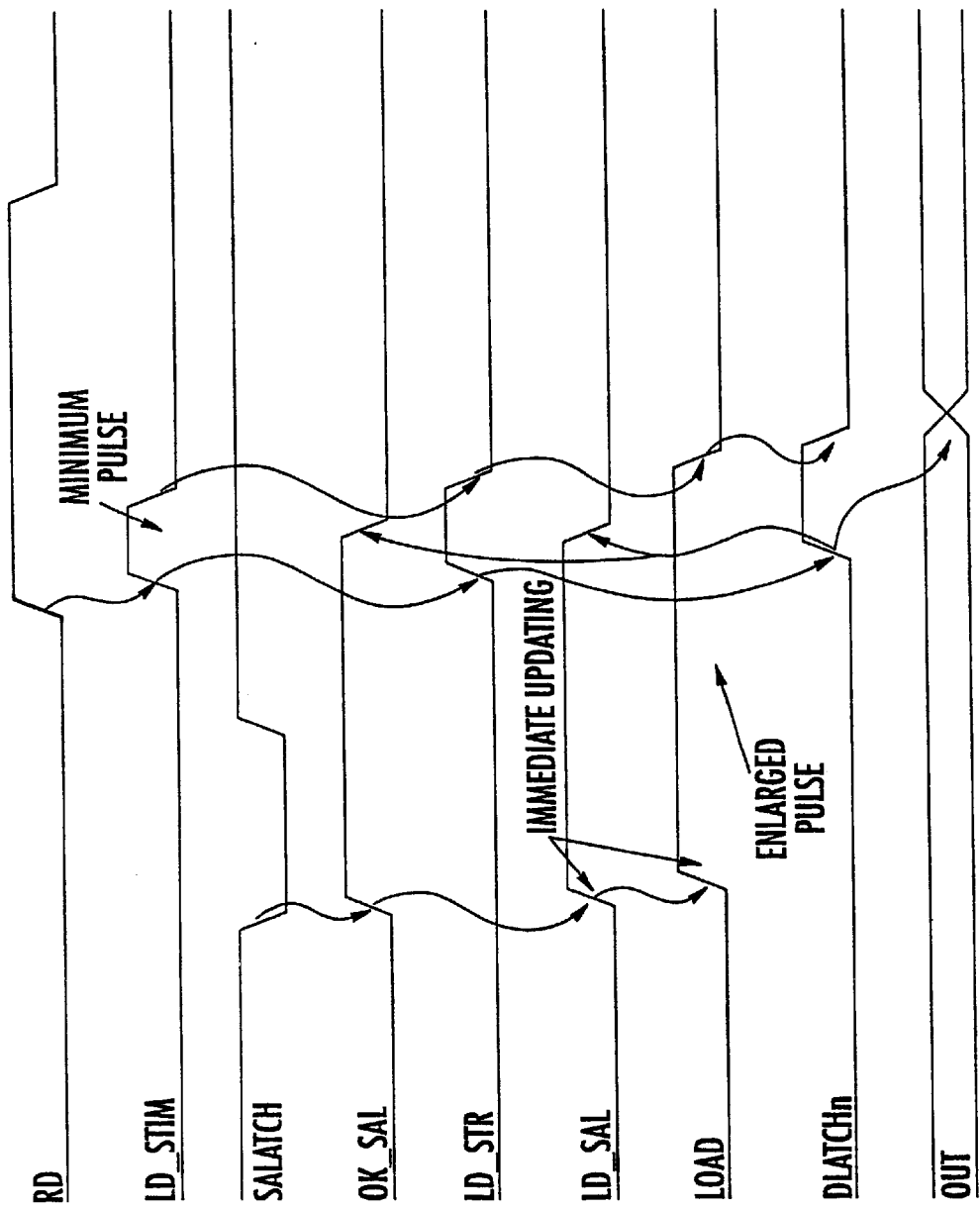
Figure 6:
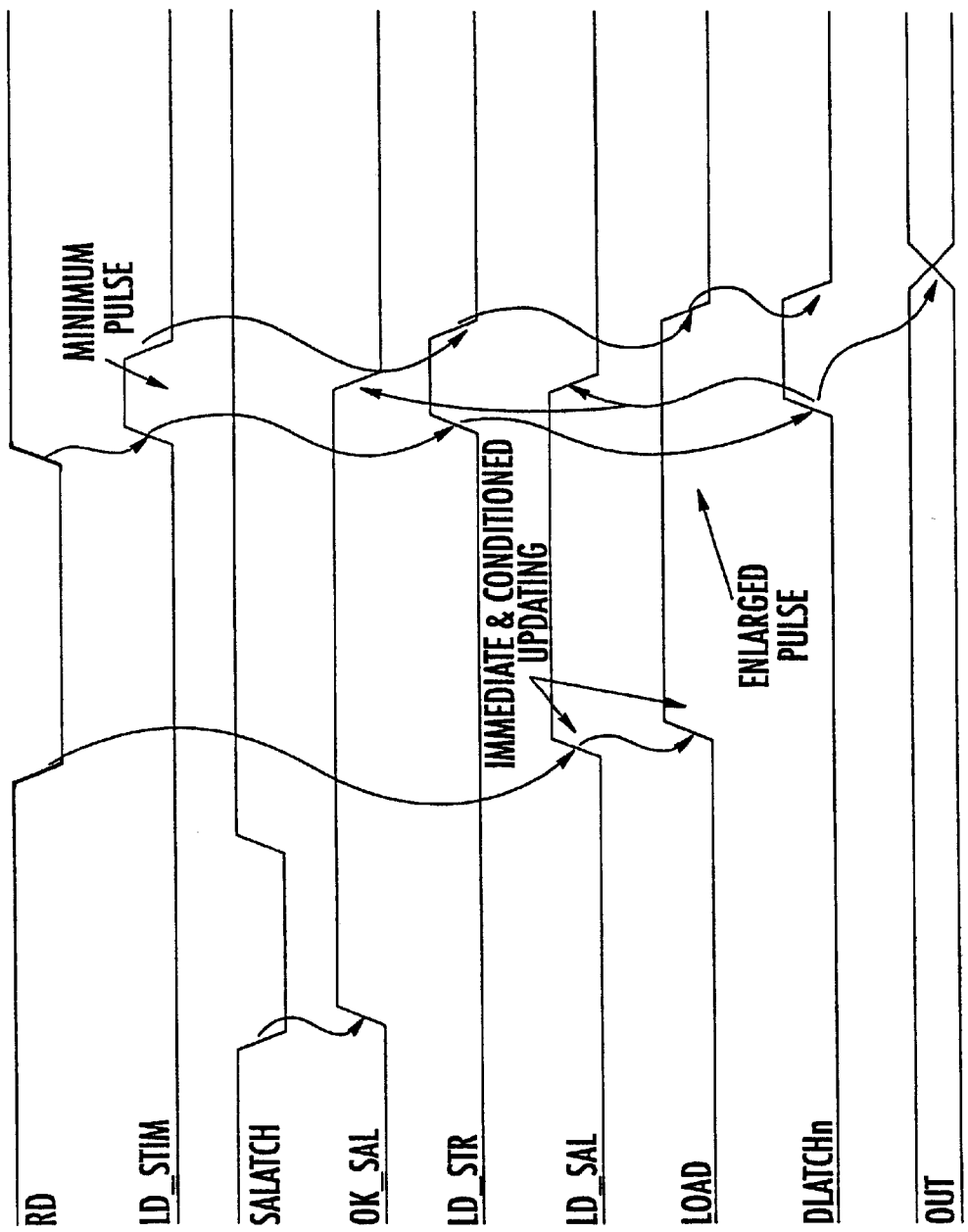

In both cases, the LATCH UPDATE FLAG circuit stores the information relative to the SAlatch signal to a low logic level. If RD=0, the data is immediately transferred on the output latch by activating LD_SAL and therefore LOAD but not DLATCHN (FIG. 5). If RD=1, its return to a low logic level is waited for before activating the transfer (FIG. 6). The reason for this is tied to the fact that, according to the considered protocol, if RD remains high, the data in the output register cannot be altered.

From FIG. 3, it may be noted that the circuits of both flags have a reset input, the function of which is to cancel, upon performing the control function, the acquired configurations of the flags to reset an original configuration appropriate to carry out a new monitoring.

As may be noted, the reset for the block LATCH UPDATE FLAG is produced by the two signals: LD_STR<i> and GLOBAL RESET. The latter has the function of correctly configuring the block at initialization. In contrast, the reset for the block ENABLING FLAG OF OUT REG UPDATE is produced by the two signals: DLATCHN and GLOBAL RESET.

It should be noted that the two propagation paths of FIG. 3 are active in a mutually exclusive fashion during the two half periods of the RD clock. That is, the final control signals, LOAD and DLATCHN, are maintained either by one or by the other path in an exclusive fashion. If the conditioned update path is enabled at the activation of the other path, it is immediately reset by the generation of the signals LD_STR<i> and DLATCHN; and if it is disabled at the activation of the other path, it is blocked for the whole half period 1 of the RD clock.

However, it should be noted, that being the nature of LD_STR<i> is a pulsed one, at the end of this pulse, the function of the update flag is immediately enabled. This makes it ready to detect and record a consequent successive updating of a new reading cycle. In this way, the end of the successive readings may be acknowledged in advance of having detected a protocol enabling condition RD=0 for the updating of the OUT_DATA_LATCH. The advantage is an enhancement of the frequency performances of the whole system.

Figure 7:
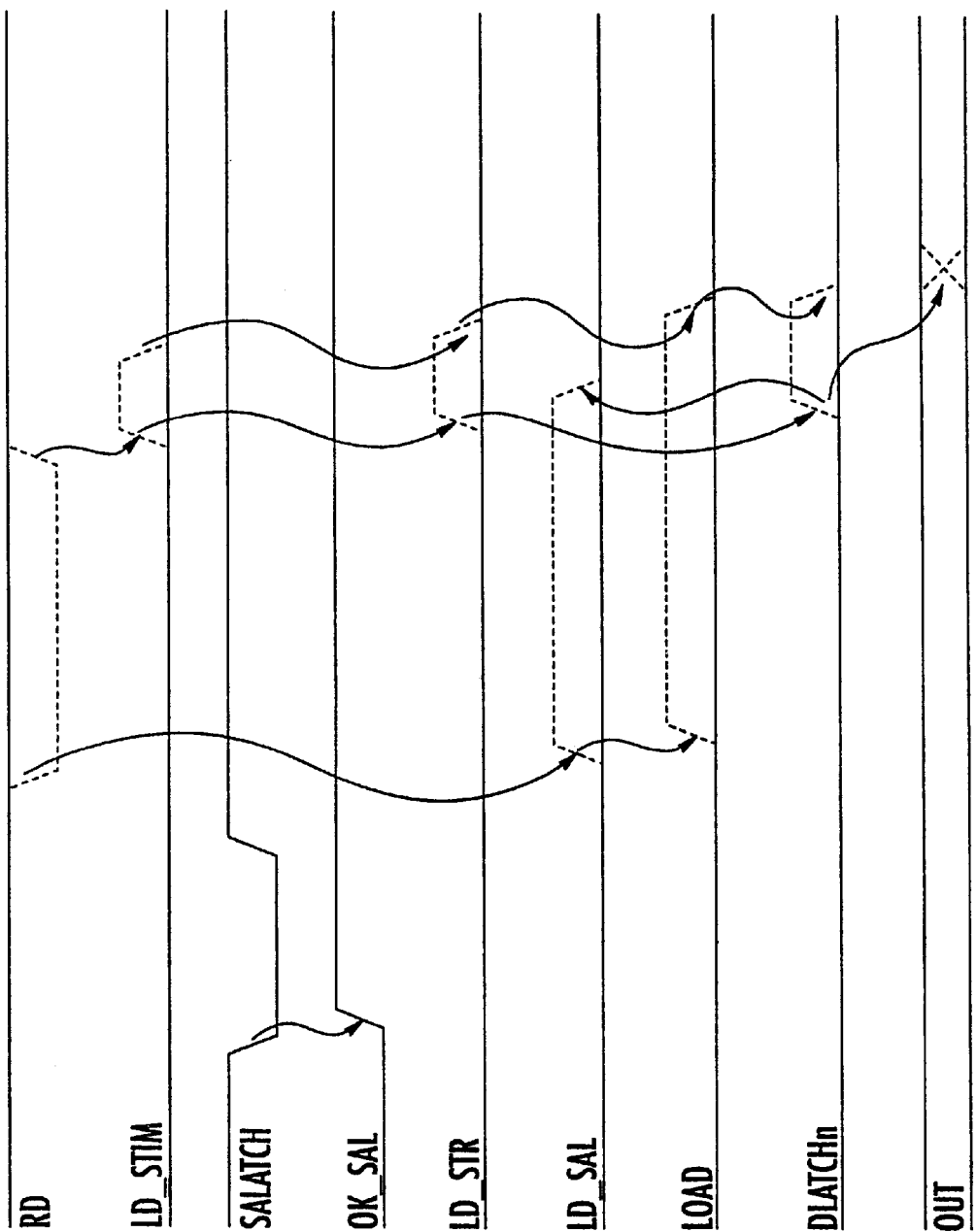
Figure 8:
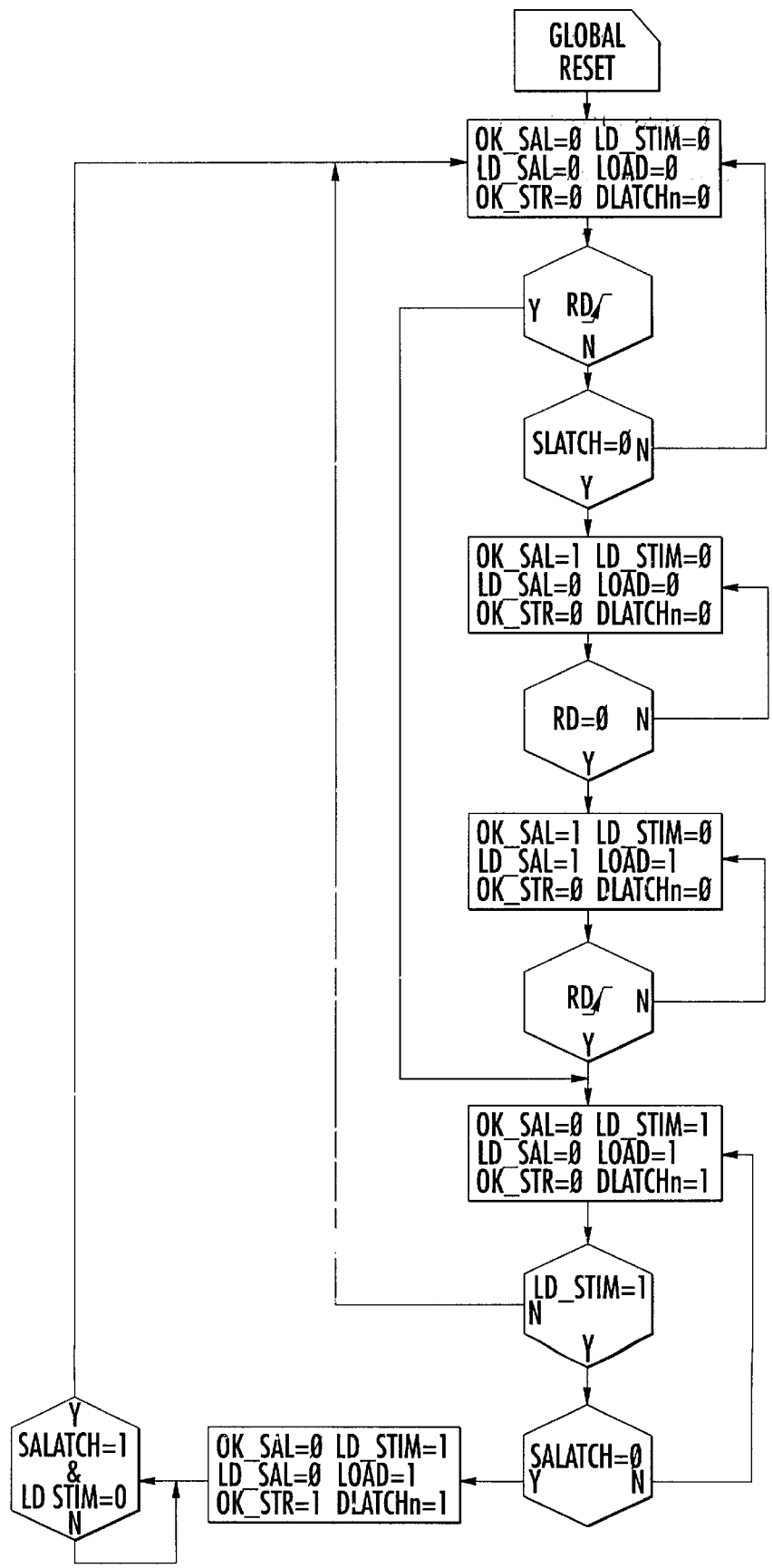
FIG. 8 is a flow chart of the management process according to the present invention.

Finally, FIG. 7 shows the situation in which the RD signal is always high. In this case, even if the reading ends regularly, no transfer of the data from the first to the second latch takes place, and there is no updating of the output. FIG. 8 is a flow chart of the operations performed by a circuit block of the invention.

Figure 9:
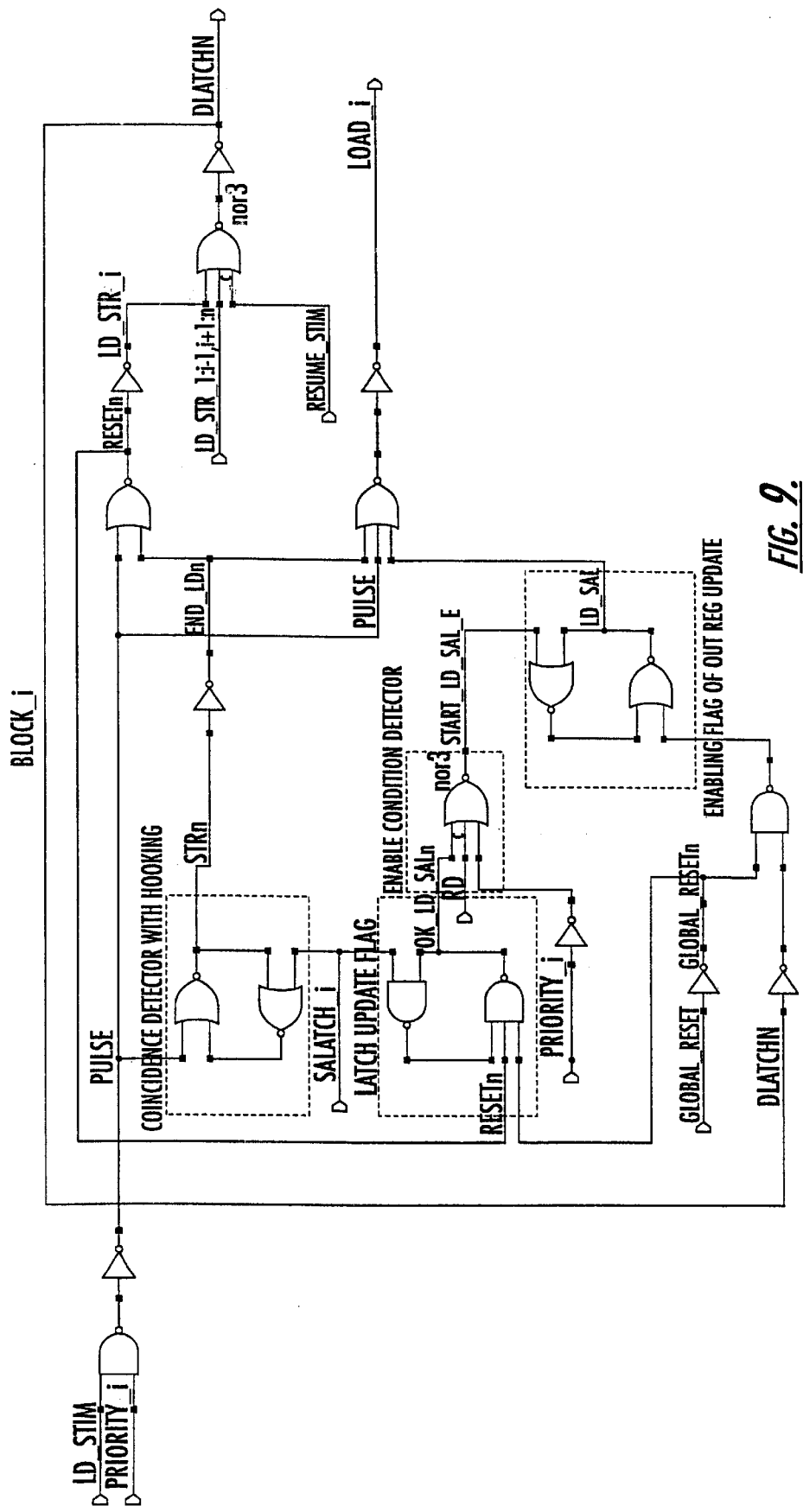
FIG. 9 is a circuit diagram implementing the managing scheme according to the present invention.
Figure 10:
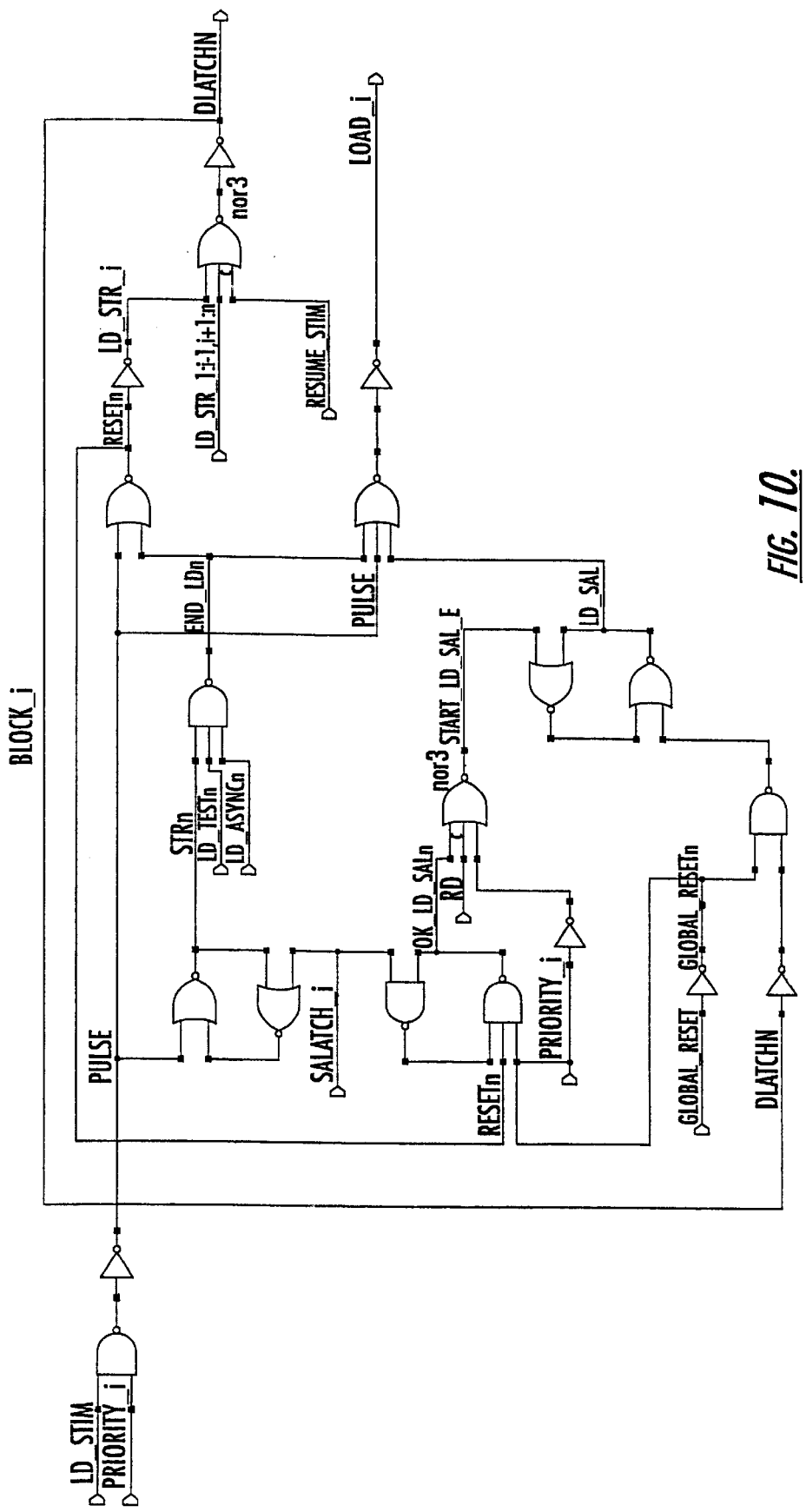
FIG. 10 is another circuit illustrating the input of auxiliary control signals according to the present invention.

FIGS. 9 and 10 are different circuit embodiments of FIG. 3. In the embodiment of FIG. 10, two additional signals LD_ASYNCn and LD_TESTn are shown. They permit the transfer of data to be output during a test mode and during asynchronous mode functioning of the memory device. Finally, the presence of the signal RESUME_STIM should be noted. This signal serves, when it is required to enable only the transfer to the output of the data present in the output latch.

That which is claimed is:

1. A control circuit for managing transfer of data within a system comprising a plurality of data sources for providing an output data stream synchronous with an external timing signal, an output register for storing data available at an output of the system, and a selection multiplexer for transferring the data from the plurality of data sources to the output register, the control circuit comprising:
   a plurality of circuit blocks, with each circuit block being connected to one of the plurality of data sources and comprising
      a detection circuit for detecting availability of the data at an output of a selected data source,
      a conditioned update path connected to said detection circuit for providing an update flag, and
      at least one logic gate having a first input for receiving the update flag and a second input for receiving an output signal from said detection circuit for providing a selection signal for the selection multiplexer.

2. The control circuit according to claim 1, wherein the system further comprises an external data line connected to the output of the system, and an output buffer connected between the output register and the external data line; and wherein the control system further comprises a pass-gate for coupling an input of the output buffer to the output register.

3. The control circuit according to claim 2, wherein said pass-gate is enabled by the output signal from a respective detection circuit.

4. The control circuit according to claim 1, wherein the conditioned update path comprises:
   a first bistable circuit for providing a first flag for enablement of the updating;
   an enable detection circuit having a first input connected to said first bistable latch for receiving the first flag; and
   a second bistable circuit connected to said enable detection circuit for providing the update flag.

5. The control circuit according to claim 4, wherein said first bistable circuit is set by an inverted confirmation signal and reset by the output signal from said detection circuit.

6. The control circuit according to claim 4, wherein said second bistable circuit is set by an output signal from said enable detection circuit and reset by the output signal from said detection circuit.

7. The control circuit according to claim 1, wherein said detection circuit further comprises a logic OR gate having a first input for receiving a first logic pulse signal and a second input for receiving a stretched signal, and an output for providing the output signal.

8. The control circuit according to claim 5, wherein said detection circuit further comprises a logic AND gate having a first input for receiving the external timing signal and a second input for receiving a selection signal corresponding to the selected data source, and an output for providing the first logic pulse signal.

9. The control circuit according to claim 1, wherein said at least one logic gate comprises a logic OR gate.

10. The control circuit according to claim 1, wherein the plurality of data sources are asynchronous.

11. The control circuit according to claim 1, wherein the plurality of data sources have different bit rates.

12. The control circuit according to claim 1, wherein the external timing signal requests updating of the data currently present at the output of the system.

13. The control circuit according to claim 1, further comprising a central control unit for providing a plurality of control signals to the plurality of data sources and to the control circuit.

14. The control circuit according to claim 1, wherein the system further comprises a pulse circuit connected to said detection circuit, said pulse circuit having an input for receiving the external timing signal and output for providing a pulse signal having a predetermined duration at each rising edge of the external timing signal.

15. The control circuit according to claim 14, wherein said detection circuit includes an input for receiving a logic AND of the pulse signal and a selection signal corresponding to the data source providing new data to be output.

16. The control circuit according to claim 1, wherein the system is an interleaved memory comprising an array of memory cells being divided into a first bank of memory cells and a second bank of memory cells, and wherein the plurality of data sources are the first and second banks of memory cells.

17. A system comprising:
   a plurality of data sources for providing an output data stream synchronous with an external timing signal;
   an output register for storing data available at an output of the system;
   a selection multiplexer for transferring the data from said plurality of data sources to said output register,
   a control circuit for managing transferring of the data within the system and comprising a plurality of circuit blocks, with each circuit block being connected to one of said plurality of data sources and comprising
      a detection circuit for detecting availability of the data at an output of a selected data source,
      a conditioned update path connected to said detection circuit for providing an update flag, and
      at least one logic gate having a first input for receiving the update flag and a second input for receiving an output signal from said detection circuit for providing a selection signal for the selection multiplexer.

18. The system according to claim 17, further comprising an external data line connected to the output of the system; and an output buffer connected between said output register and said external data line; and wherein said control system further comprises a pass-gate for coupling an input of said output buffer to said output register.

19. The system according to claim 18, wherein said pass-gate is enabled by the output signal from a respective detection circuit.

20. The system according to claim 17, wherein the conditioned update path comprises:
   a first bistable circuit for providing a first flag for enablement of the updating;
   an enable detection circuit having a first input connected to said first bistable latch for receiving the first flag; and
   a second bistable circuit connected to said enable detection circuit for providing the update flag.

21. The system according to claim 20, wherein said first bistable circuit is set by an inverted confirmation signal and reset by a the output signal from said detection circuit.

22. The system according to claim 20, wherein said second bistable circuit is set by an output signal from said enable detection circuit and reset by the output signal from said detection circuit.

23. The system according to claim 17, wherein said circuit further comprises a logic OR gate having a first input for receiving a first logic pulse signal and a second input for receiving a stretched signal, and an output for providing the output signal.

24. The system according to claim 23, wherein said detection circuit further comprises a logic AND gate having a first input for receiving the external timing signal and a second input for receiving a selection signal corresponding to the selected data source, and an output for providing the first logic pulse signal.

25. The system according to claim 17, wherein said logic gate comprises a logic OR gate.

26. The system according to claim 17, wherein said plurality of data sources are asynchronous.

27. The system according to claim 17, wherein said plurality of data sources have different bit rates.

28. The system according to claim 17, wherein the external timing signal requests updating of the data currently present at the output of the system.

29. The system according to claim 17, wherein the system is an interleaved memory comprising an array of memory cells being divided into a first bank of memory cells and a second bank of memory cells, and wherein said plurality of data sources are the first and second banks of memory cells.

30. A method for managing transfer of data within a system comprising a plurality of data sources for providing an output data stream synchronous with an external timing signal, an output register for storing data available at an output of the system, a selection multiplexer for transferring the data from the plurality of data sources to the output register, and a plurality of circuit blocks with each circuit block being connected to one of the plurality of data sources, the method comprising:
   detecting availability of the data at an output of a selected data source using a detection circuit;
   providing an update flag via a conditioned update path connected to the detection circuit; and
   performing at least one logic function based upon the update flag and an output signal from the detection circuit for providing a selection signal for the selection multiplexer.

31. The method according to claim 30, wherein the system further comprises an external data line connected to the output of the system, and an output buffer connected between the output register and the external data line; and wherein the control system further comprises a pass-gate for coupling an input of the output buffer to the output register.

32. The method according to claim 31, further comprising enabling the pass-gate by the output signal from a respective detection circuit.

33. The method according to claim 30, wherein the conditioned update path comprises:
- a first bistable circuit for providing a first flag for enablement of the updating;
- an enable detection circuit having a first input connected to said first bistable latch for receiving the first flag; and
- a second bistable circuit connected to said enable detection circuit for providing the update flag.

34. The method according to claim 30, wherein performing at least one logic function comprises performing at least one logic OR function.

35. The method according to claim 30, wherein the plurality of data sources are asynchronous.

36. The method according to claim 30, wherein the plurality of data sources have different bit rates.

37. The method according to claim 30, wherein the external timing signal requests updating of the data currently present at the output of the system.

38. The method according to claim 30, further comprising providing a plurality of control signals to the plurality of data sources and to the control circuit using a central control unit.

39. The method according to claim 30, wherein the system is an interleaved memory comprising an array of memory cells being divided into a first bank of memory cells and a second bank of memory cells, and wherein the plurality of data sources are the first and second banks of memory cells.

* * * * *